United States Patent
Meinhold et al.

(10) Patent No.: US 7,091,134 B1
(45) Date of Patent: Aug. 15, 2006

(54) DEPOSITION OF INTEGRATED CIRCUIT FABRICATION MATERIALS USING A PRINT HEAD

(75) Inventors: Henner W. Meinhold, Fremont, CA (US); Wayne Cai, Milpitas, CA (US); Mark L. Rea, Hayward, CA (US); Sachin M. Chinchwadkar, Milpitas, CA (US)

(73) Assignee: Novellus Systems, Inc., San Jose, CA (US)

( * ) Notice: Subject to any disclaimer, the term of this patent is extended or adjusted under 35 U.S.C. 154(b) by 307 days.

(21) Appl. No.: 10/464,279

(22) Filed: Jun. 17, 2003

(51) Int. Cl.
*H01L 21/31* (2006.01)

(52) U.S. Cl. .............. 438/758; 438/5; 438/14

(58) Field of Classification Search ........ 438/5, 438/14, 758; 347/14, 19
See application file for complete search history.

(56) References Cited

U.S. PATENT DOCUMENTS

| | | | |
|---|---|---|---|
| 3,852,768 A | 12/1974 | Carmichael, et al. | |
| 4,812,859 A * | 3/1989 | Chan et al. | 347/63 |
| 4,922,268 A | 5/1990 | Osborne | |
| 2003/0011663 A1 | 1/2003 | Sarmast | |
| 2004/0231594 A1* | 11/2004 | Edwards et al. | 118/719 |

OTHER PUBLICATIONS

Charge Sensitive Preamplifier A250, State-of-the-Art, Webpage [online][retrieved on Feb. 6, 2002]. Retrieved from the Internet: URL:http://www.amptek.com/a250.htm>.
IJT print head, Ink Jet Technology Inc., Webpage [online][retrieved on Feb. 8, 2002]. Retrieved from the Internet: URL:http://www.amptek.com/a250.html>.

* cited by examiner

*Primary Examiner*—Alexander Ghyka
(74) *Attorney, Agent, or Firm*—Okamoto & Benedicto LLP

(57) ABSTRACT

In one embodiment, an integrated circuit (IC) fabrication material is dispensed from a print head by dividing its nozzles into several groups, and sequentially allowing each group to fire. The nozzles may be grouped based on the amounts of material they dispense. For example, the nozzles may be grouped by drop volume or drop mass. In one embodiment, an IC fabrication material is dispensed on a substrate by controlling a firing sequence of a nozzle to promote merging of material on the substrate. The firing sequence may also be altered to take into account the firing sequence of adjacent nozzles.

12 Claims, 7 Drawing Sheets

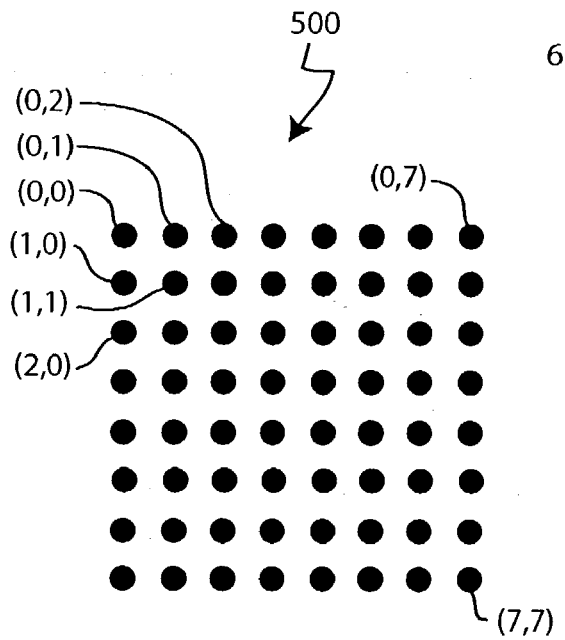

DEPOSITION OF INTEGRATED CIRCUIT FABRICATION MATERIALS USING A PRINT HEAD

BACKGROUND OF THE INVENTION

1. Field of the Invention

The present invention relates generally to integrated circuit (IC) fabrication, and more particularly but not exclusively to deposition of IC fabrication materials using a print head.

2. Description of the Background Art

The use of ink jet technology to print on paper is well known. A typical ink jet print head has several nozzles that are coupled to an ink reservoir. Ink from the reservoir are dispensed through the nozzles to form a pattern on paper. The ink jet print head may be scanned relative to the paper, or vice versa, to cover a large area.

FIG. 1 schematically illustrates the operation of an exemplary ink jet print head 20. Print head 20 may be of the type available from Ink Jet Technology Inc. of San Jose, Calif., for example. Print head 20 may have any number of nozzles 22 (i.e., 22-1, 22-2, ...) but only four are shown for clarity of illustration. A digital firing pattern may be serially loaded into a firing register 23 of print head 20 to enable or disable a nozzle 22. Each nozzle 22 may have a corresponding bit position in firing register 23. A logical "1" enables a nozzle 22 to fire (i.e., dispense ink), while a logical "0" disables a nozzle 22 from firing. For example, assuming a 4-bit firing register 23, a firing pattern of "1000" may be loaded into firing register 23 to enable firing of nozzle 22-1 but not nozzles 22-2, 22-3, and 22-4; a firing pattern of "1001" may be loaded into firing register 23 to enable firing of nozzles 22-1 and 22-4 but not nozzles 22-2 and 22-3; and so on.

Each nozzle 22 may be coupled to an ink reservoir via a chamber (not shown). Ink flows from the reservoir into the chambers prior to being dispensed out of nozzles 22. The amount of ink drawn into the chambers, and thus the amount of ink dispensed by nozzles 22, may be controlled by loading an appropriate timing pattern into a timing circuit 24. Timing circuit 24 converts the timing pattern into timing pulses that are applied to all nozzles 22.

The use of ink jet technology in the fabrication of integrated circuits (IC's) is disclosed in commonly-assigned U.S. Pat. No. 6,436,843, which is incorporated herein by reference in its entirety. Unlike paper printing applications where the emphasis is on printing sharply delineated marks, film deposition in an IC fabrication process is concerned with dispensing a uniform amount of material on a substrate. This uniform amount may be in terms of unit volume per unit area. Because of manufacturing tolerances, the nozzles of a print head may dispense varying amounts of material for the same timing pulses. The amount of material dispensed from nozzles, which may be in terms of drop volume, may vary by 10% or more from nozzle to nozzle for a given print head.

One way of compensating for variations in drop volume is to provide a separate timing circuit for each nozzle. This approach, however, requires relatively expensive electronics and bulky cabling as each nozzle may have to be connected to its own drive circuit with independent timing. Using a relatively low-cost, off-the-shelf print head poses its share of problems because such a print head typically employs a serially loaded firing register and a common timing circuit for all nozzles. Conventionally, a common timing circuit does not allow for the use of a tuned timing pattern for each individual nozzle without adversely affecting print frequency.

SUMMARY

In one embodiment, an integrated circuit (IC) fabrication material is dispensed from a print head by dividing its nozzles into several groups, and sequentially allowing each group to fire. The nozzles may be grouped based on the amounts of material they dispense. For example, the nozzles may be grouped by drop volume or drop mass.

In one embodiment, an IC fabrication material is dispensed on a substrate by controlling a firing sequence of a nozzle to promote merging of material on the substrate. The firing sequence may also be altered to take into account the firing sequence of adjacent nozzles.

These and other features of the present invention will be readily apparent to persons of ordinary skill in the art upon reading the entirety of this disclosure, which includes the accompanying drawings and claims.

DESCRIPTION OF THE DRAWINGS

FIG. 5 schematically illustrates an example print area in accordance with an embodiment of the present invention.

FIG. 6 shows an example firing table in accordance with an embodiment of the present invention.

FIG. 7 shows an example offset table in accordance with an embodiment of the present invention.

DETAILED DESCRIPTION

In the present disclosure, numerous specific details are provided such as examples of systems, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
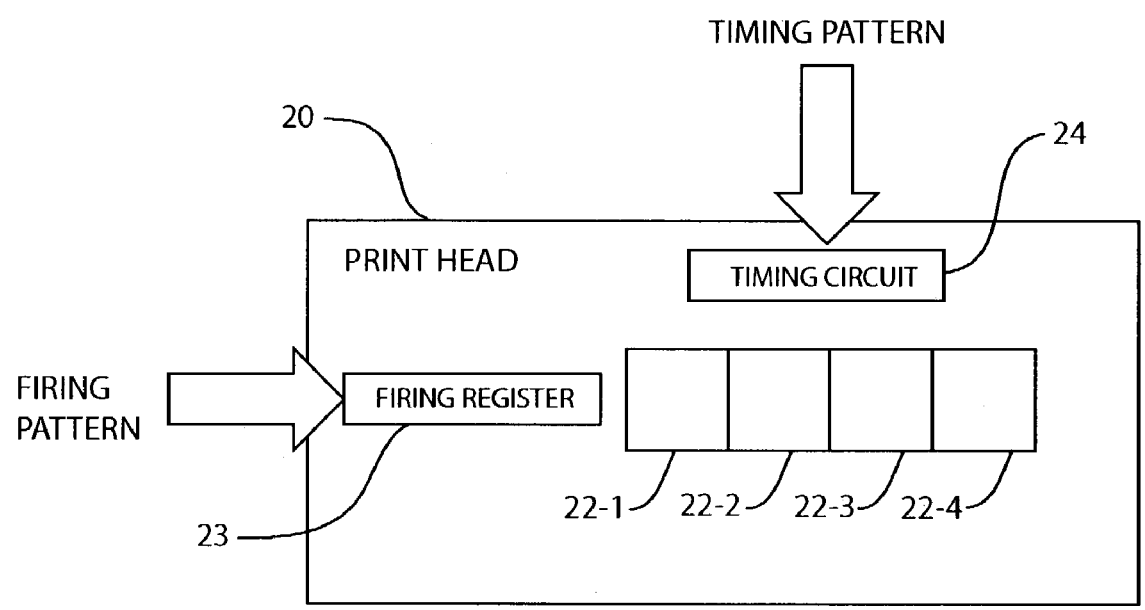
FIG. 1 schematically illustrates the operation of an exemplary ink jet print head.
Figure 2:
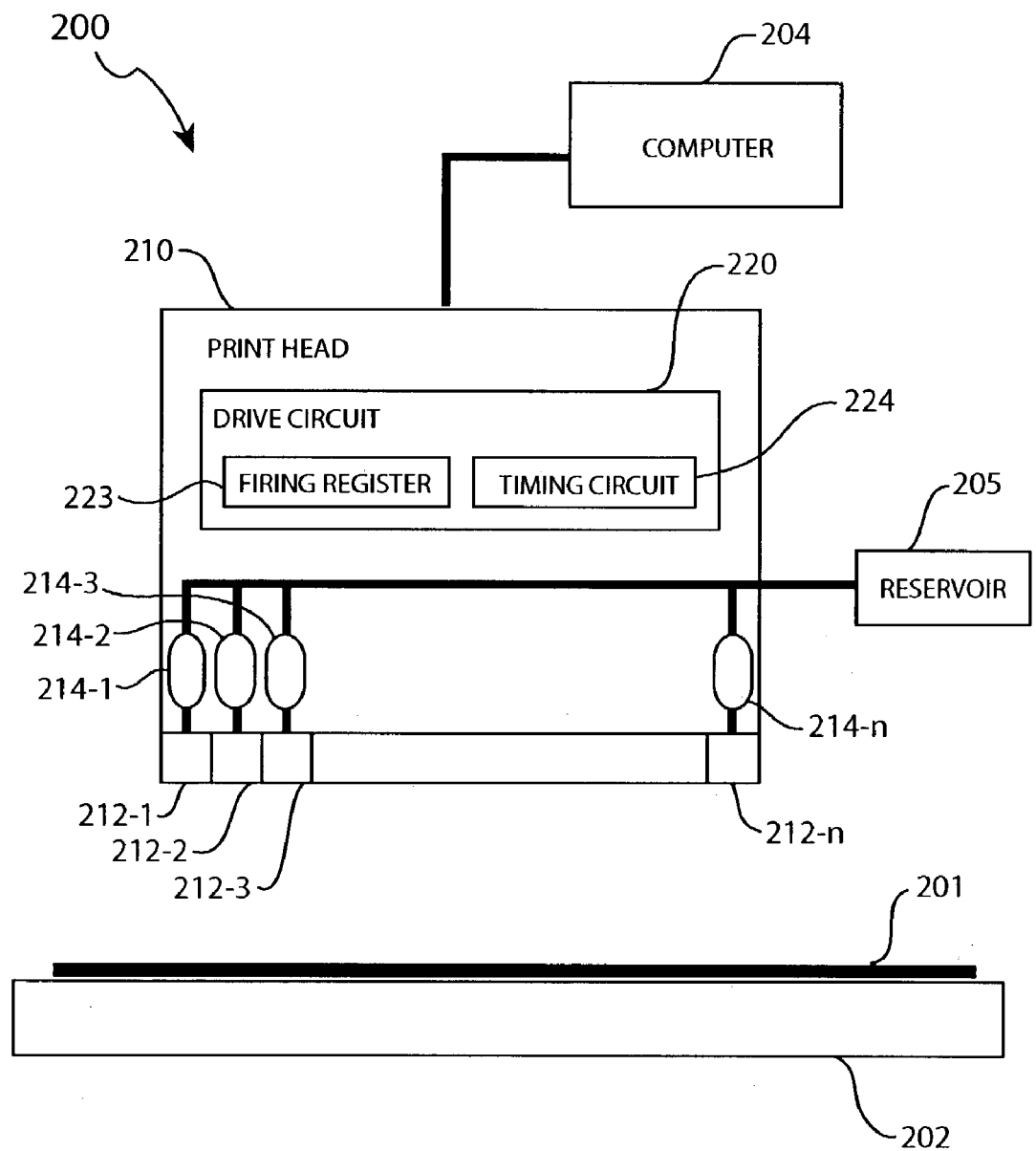
FIG. 2 schematically shows a an integrated circuit (IC) fabrication system in accordance with an embodiment of the present invention.

FIG. 2 schematically shows a an integrated circuit (IC) fabrication system 200 in accordance with an embodiment of the present invention. System 200 includes a computer 204, a print head 210, a pedestal 202, and a reservoir 205. Pedestal 202 supports a substrate 201, which may be a semiconductor wafer, for example. System 200 may be employed to deposit an IC fabrication material on substrate 201. Examples of IC fabrication materials that may be deposited on a substrate using system 200 include dielectric materials, photoresists, developers, slurries, cleaning liquids, and silica based solutions (e.g., spin-on glass). An IC fabrication material is stored in reservoir 205 for delivery to print head 210. Print head 210 may be scanned on substrate 201 to deposit material thereon. Substrate 201 may also be scanned relative to print head 210 by employing a moveable pedestal 202.

In one embodiment, print head 210 comprises an ink jet print head, such as those of the type available from Ink Jet Technology, Inc. (URL:<http://www.inkjet-tech.com>). Print head 210 comprises nozzles 212 (i.e., 212-1, 212-2, . . . ), chambers 214 (i.e., 214-1, 214-2, . . . ), and a drive circuit 220. In one embodiment, print head 210 has 64 nozzles arranged in a single row.

Drive circuit 220 is depicted as being integrated with print head 210. However, drive circuit 220 may also be external to print head 210. For example, drive circuit 220 may be a separate card cabled to print head 210. Drive circuit 220 includes a firing register 223 for accepting a firing pattern, and a timing circuit 224 for accepting a timing pattern and converting them to timing pulses. The timing pattern may be a single signal (e.g., a single digital data) or several signals (e.g., several digital data loaded into several registers).

Firing register 223 may be a serially loaded shift register for accepting a digital firing pattern. Each nozzle 212 may be enabled or disabled from firing by setting or resetting a corresponding bit in firing register 223. For example, loading a logical "1" in the most significant bit of firing register 223 enables nozzle 212-1 to fire, while loading a logical "0" in the same bit position disables nozzle 212-1 from firing. A firing pattern may be shifted into register 223 prior to firing. For example, a 64-bit firing pattern may be shifted into firing register 223 prior to firing nozzles 212. Nozzles 212 that are enabled by the loaded firing pattern will dispense a material upon receipt of timing pulses from timing circuit 224.

Each nozzle 212 is coupled to a chamber 214 (i.e., 214-1, 214-2, . . . ). Chambers 214, in turn, are coupled to reservoir 205 containing an IC fabrication material to be deposited onto substrate 201. Timing pulses from timing circuit 224 control the amount of material flowing into the chambers 214 and dispensed out of enabled nozzles 212. Timing pulses may be tuned to dispense a desired amount of material from nozzles 212. That is, a timing pattern may be tuned to generate particular timing pulses and thereby control the amount of material dispensed by nozzles 212.

The tuning of a timing pulse will depend on the specific print head 210 employed. For example, ink jet print heads from Ink Jet Technology, Inc. may be configured to dispense a desired amount of material by using so called "double pulse" or "inverted pulse" timing pulses. With double pulse, timing pulses comprising a square wave have four contiguous time periods namely, T1, T2, T3, and T4. At time T1, a piezo-crystal (not shown) is actuated to expand a chamber 214 to draw material from reservoir 205. At time T2, the piezo-crystal is actuated to relax the chamber 214 and dispense the drawn material out of the nozzle 212. At time T3, the piezo-crystal is actuated to expand the chamber 214 to reduce the amount of spraying after the material is dispensed out of the nozzle 212. At time T4, the piezo-crystal is actuated to relax the chamber 214 to a stationary position. By varying the width of T1, T2, T3, and/or T4, the amount of material dispensed by the nozzle 212 may be controlled.

Print head 210 is also known as a "serially loaded print head" because it employs a serially loaded firing register 223 and a common (i.e., single) timing circuit 220 for all nozzles 212. To dispense material from nozzles 212, a timing pattern is serially loaded into firing register 223. Timing pulses are then applied to all nozzles 212. This causes enabled nozzles 212 to fire and dispense droplets of the material on substrate 201.

Still referring to FIG. 2, a computer 204 may be coupled to print head 210. Computer 204 serves as a controller for directing the operation of print head 210 and other components of system 200. Computer 204 may be a general or special purpose computer equipped with data acquisition and control components, for example.

To deposit a uniform coat of material on substrate 201, it is desirable to have all nozzles 212 to dispense substantially the same amount of material. The amount of material may be in terms of drop volume (i.e., the volume of a droplet of material dispensed by a nozzle 212) or in terms of drop mass (i.e., the mass of a droplet of material dispensed by a nozzle 212), for example. Coating uniformity may be in terms of deposited material volume per unit area. However, as mentioned, drop volume variation from nozzle to nozzle may be 10% or more for a given print head because of the difficulty of manufacturing identical nozzles. One approach to this problem is to generate nozzle configuration parameters, such as firing and timing patterns, that are tuned for each individual nozzle. For example, tuned firing and timing patterns may be loaded into drive circuit 220 to fire (i.e., actuate to dispense material from) nozzle 212-1. Right thereafter, tuned firing and timing patterns may be loaded into drive circuit 220 to fire nozzle 212-2, and so on. Unfortunately, this approach reduces the overall print frequency to a relatively low level. Assuming each firing of a nozzle 212 takes 60 µs, firing 64 nozzles would take 3840 µs (i.e., 64×60 µs). This is equivalent to a print frequency of 260 Hz (i.e., 1/3840 µs), which is too low for applications requiring a print frequency of at least 2 KHz.

Figure 3A:
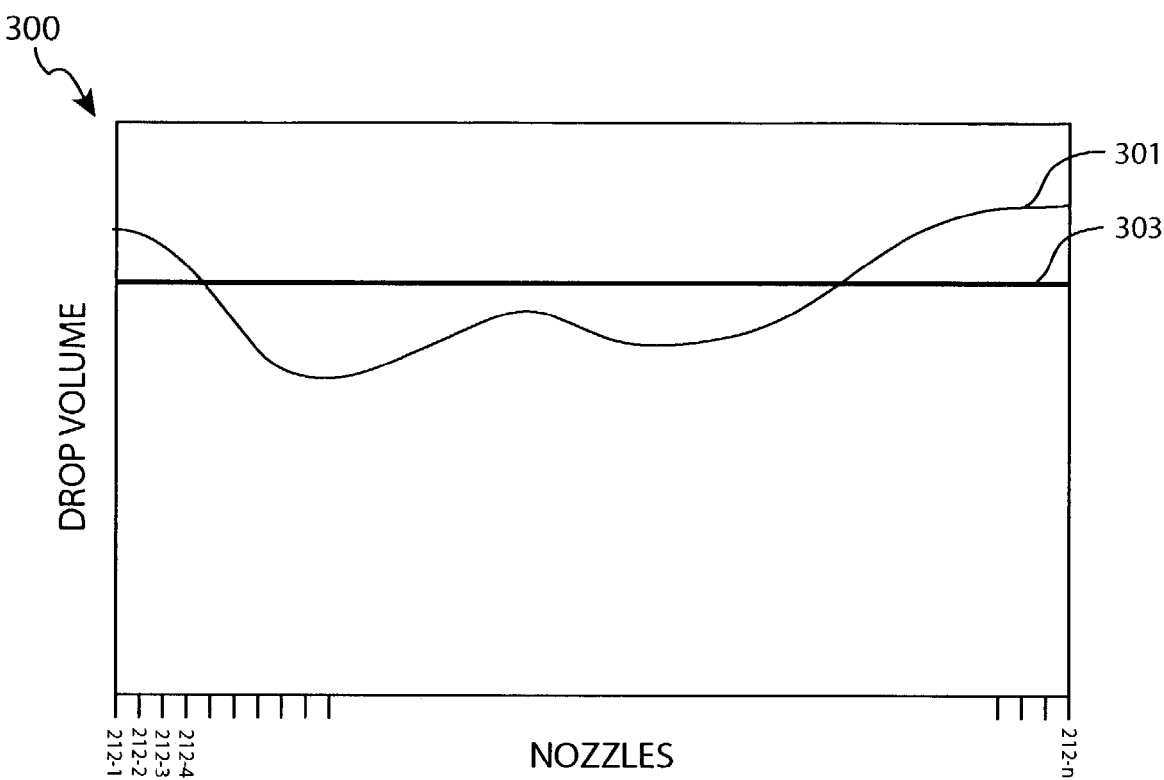
FIG. 3(a) shows an example chart of drop volume distribution in accordance with an embodiment of the present invention.

An embodiment of the present invention is now described with reference to FIGS. 3(a)–3(c). Beginning with FIG. 3(a), there is shown a chart 300 of an example drop volume distribution for a print head 210 having n-nozzles in accordance with an embodiment of the present invention. In chart 300, the vertical axis represents drop volume, while the horizontal axis represents nozzles. Chart 300 includes an actual drop volume plot 301 and a desired drop volume plot 303. Plot 301 is an example plot of drop volume for nozzles 212-1, 212-2, . . . , and 212-n. Plot 303 is an example plot of a desired or target drop volume. That is, plot 303 shows a desired drop volume for nozzles 212, while plot 301 shows the actual drop volumes of nozzles 212. Note the drop volume variation from nozzle to nozzle, and the difference between the desired drop volume and actual drop volumes.

A plot of drop volume versus nozzle, such as plot 301, may be generated by measuring the drop volume of each nozzle of a print head. The drop mass of a nozzle, which can be converted to drop volume, may be measured using the technique disclosed in commonly-assigned U.S. application Ser. No. 10/087,539, entitled "Sensor For Detecting Droplet Characteristics," filed on Mar. 1, 2002 by Henner W. Meinhold, Mark L. Rea, Sachin M. Chinchwadkar, Fred J. Chetcuti, and John S. Drewery, which is incorporated herein by reference in its entirety. Another way of measuring the drop volume of each nozzle is to print a line of material using a single nozzle and then measuring the cross section of the line using a profilometer. Other techniques for measuring the drop volume of a nozzle may also be employed without detracting from the merits of the present invention.

Once the drop volumes of all nozzles 212 are determined, nozzles 212 are divided into several groups. In one embodiment, the grouping of nozzles 212 is based on drop volume. Specifically, nozzles 212 with similar drop volumes are grouped together. The number of groups of nozzles 212 will depend on the application. Generally speaking, more groups will result in better uniformity but lower print frequency. Conversely, the less groups, the higher the print frequency. In one embodiment using a 64-nozzle print head 210, nozzles 212 are divided into 8 groups. Assuming less than 10% drop volume variation between nozzles 212, nozzles 212 belonging to a group may have less than 1.5% drop volume variation (e.g., 10% divided by 8 groups is 1.25%).

Figure 3B:
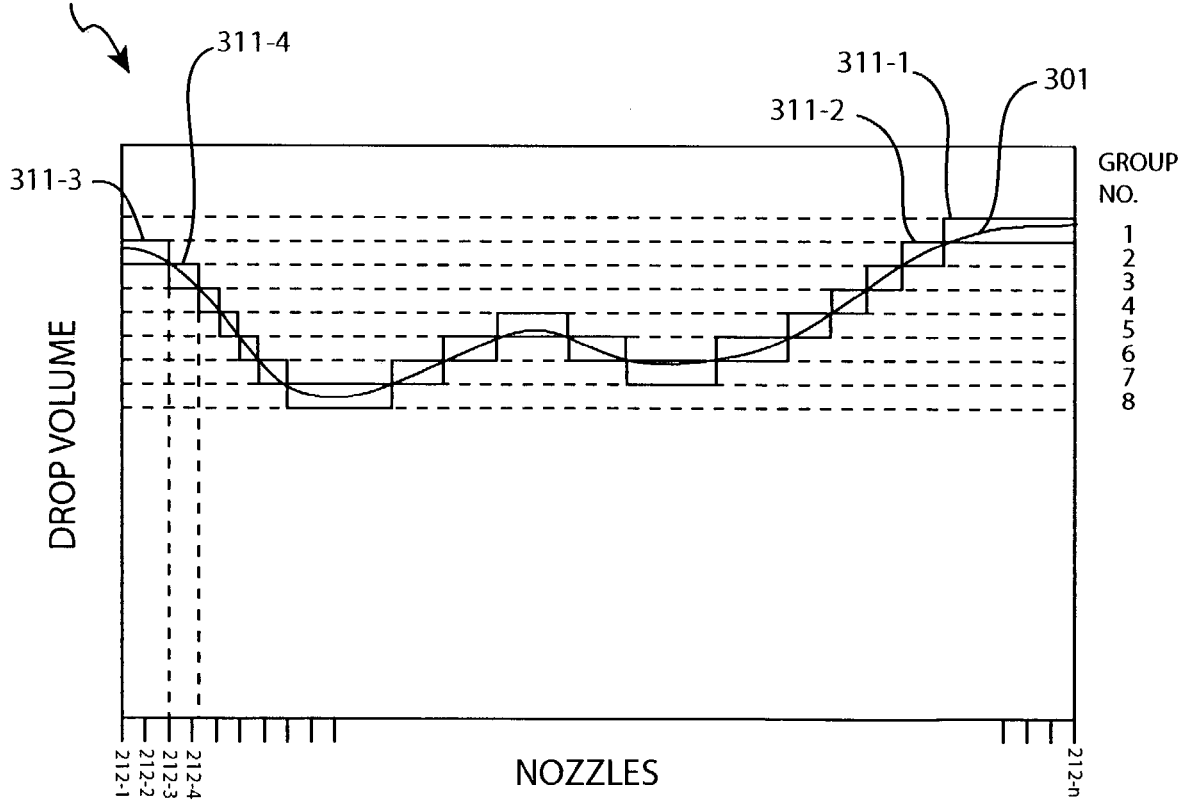
FIG. 3(b) schematically illustrates an example grouping of nozzles in accordance with an embodiment of the present invention.
Figure 3C:
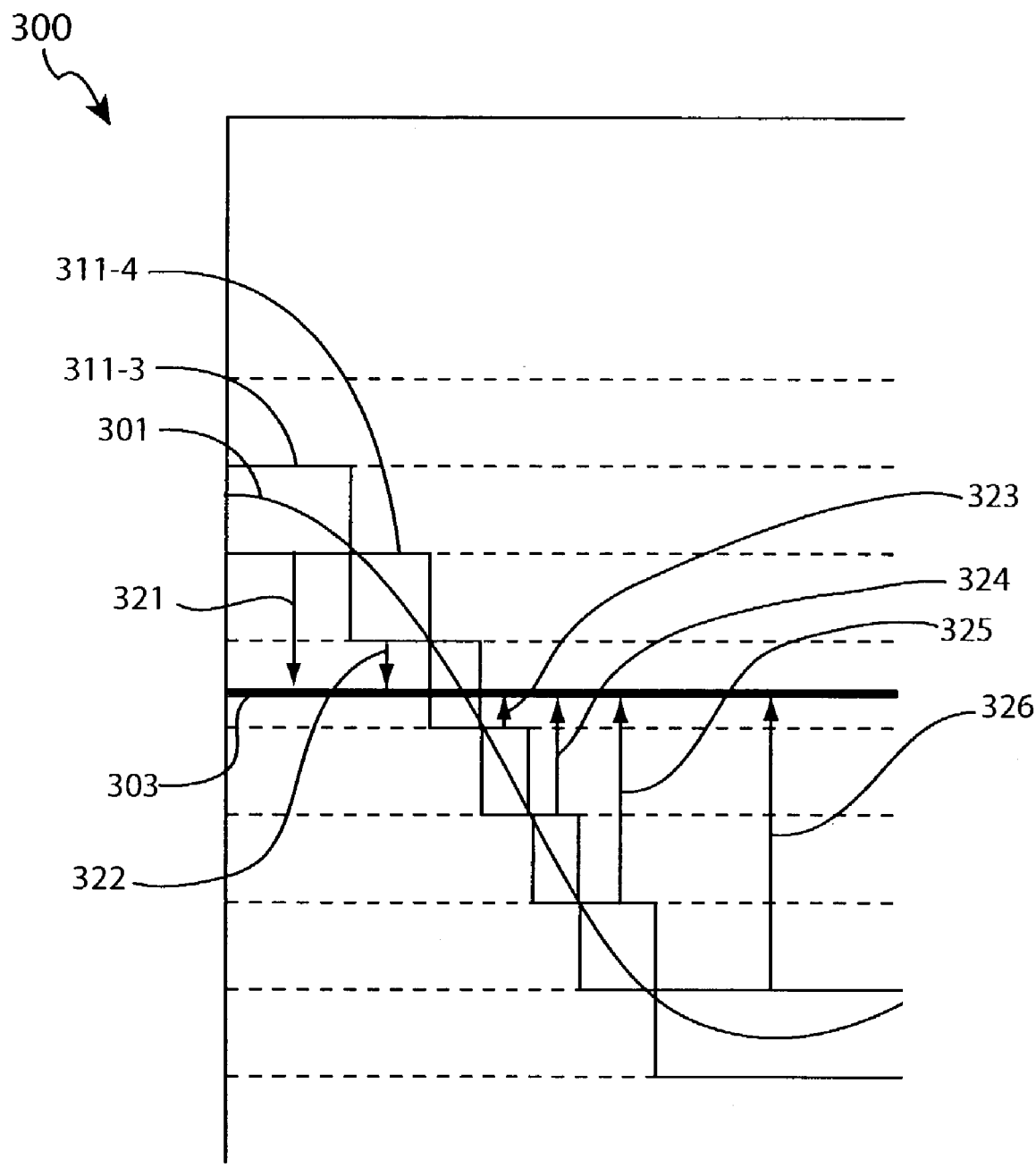
FIG. 3(c), which is a magnified view of the upper left hand corner of the chart of FIG. 3(b), schematically illustrates the tuning of nozzles for each group in accordance with an embodiment of the present invention.

FIG. 3(b) schematically illustrates an example grouping of nozzles 212 in accordance with an embodiment of the present invention. Each box 311 (i.e., 311-1, 311-2, . . . ) denotes a grouping of nozzles 212. In the example of FIG. 3(b), box 311-1 denotes nozzles 212 belonging to group number 1, boxes 311-2 and 311-3 denote nozzles 212 belonging to group number 2, and so on. Each nozzle 212 belonging to a group may be determined from the horizontal axis of chart 300. In the example of FIG. 3(b), box 311-3 includes nozzles 212-1, 212-2, and 212-3 (i.e., nozzles 212-1, 212-2, and 212-3 belong to group number 2), box 311-4 includes nozzle 214 (i.e., nozzle 214 belongs to group number 3), and so on. Note that only some of boxes 311 in FIG. 3(b) have been labeled to avoid cluttering the figure.

After the nozzles are divided into groups, all nozzles belonging to a particular group are configured to dispense similar amounts of material. In one embodiment, this is performed by tuning the timing pattern for a group of nozzles 212 such that the drop volume of nozzles 212 in that group will be relatively close to one another. FIG. 3(c), which is a magnified view of the upper left hand corner of chart 300 of FIG. 3(b), schematically illustrates the tuning of nozzles 212 for each group in accordance with an embodiment of the present invention. In the example of FIG. 3(c), arrows 321-326 indicate the direction of adjustment for achieving a drop volume close to that indicated by desired volume plot 303. Specifically, nozzles 212 for box 311-3 (i.e., nozzles belonging to group number 2 in this example) are tuned down as indicated by arrow 321, nozzles 212 for box 311-4 (i.e., nozzles belonging to group number 3 in this example) are tuned down as indicated by arrow 322, and so on.

After the nozzle configuration parameters for each group of nozzles are determined, each group of nozzles are sequentially fired. For example, all nozzles 212 belonging to group number 1 may be fired using a tuned timing pattern for group number 1. Thereafter, all nozzles 212 belonging to group number 2 may be fired using a tuned timing pattern for group number 2, and so on. As another example, the groups may be sequentially fired as follows:

1) load a firing pattern for enabling all nozzles 212 belonging to group number 1;
2) fire all nozzles belonging to group number 1 using a tuned timing pattern for group number 1;
3) load a firing pattern for enabling all nozzles 212 belonging to group number 2;
4) fire all nozzles belonging to group number 2 using a tuned timing pattern for group number 2;
5) etc.

In light of the present disclosure, those of ordinary skill in the art will appreciate that the just disclosed technique of dispensing material from a print head may be employed with serially loaded pint heads without severely affecting print frequency. In the above example and assuming a nozzle firing time of 60 µs, all 8 groups can be fired within 480 µs (i.e., 8×60 µs). This results in a print frequency of about 2.08 kHz (i.e., 1/480 µs), which is acceptable in a lot of IC fabrication applications.

Figure 4:
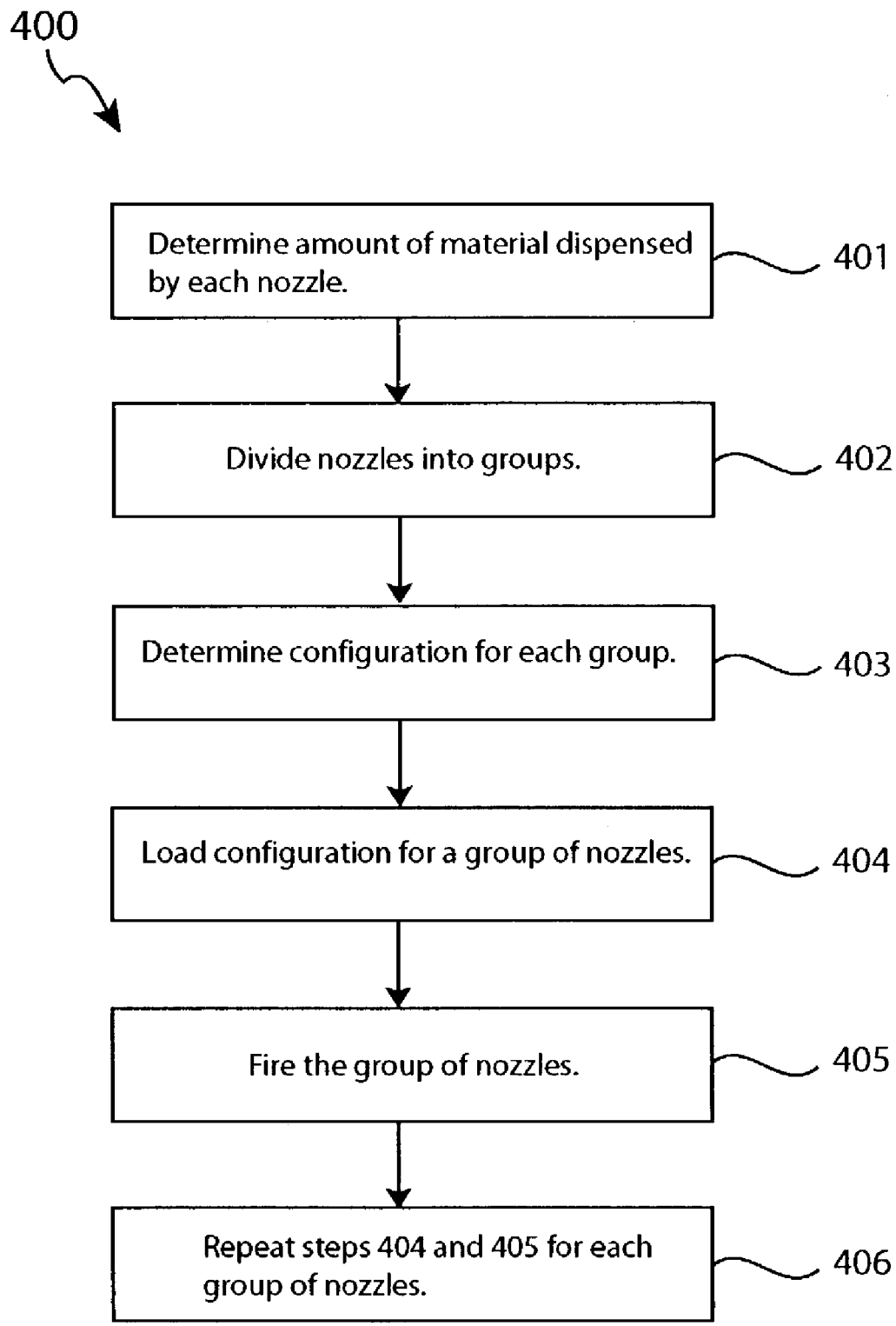
FIG. 4 shows a flow diagram of a method of dispensing a material from a print head in accordance with an embodiment of the present invention.

FIG. 4 shows a flow diagram of a method 400 for dispensing a material from a print head in accordance with an embodiment of the present invention. Beginning in step 401, the amount of material dispensed by each nozzle of a print head is determined. The amount of material may be in terms of drop mass or drop volume, for example.

In step 402, the nozzles of the print head are divided into groups. In one embodiment, the nozzles of the print head are divided by drop volume. That is, nozzles with similar drop volumes are grouped together.

In step 403, a configuration for each group is determined. The configuration may comprise parameters that would allow nozzles within a group to dispense similar amounts of material. In one embodiment, the configuration for each group includes a firing pattern for enabling nozzles in the group to fire, and a timing pattern for dispensing similar amounts of material from the nozzles in the group. As a specific example, assuming the use of an ink jet print head from Ink Jet Technology, Inc., periods T1, T2, T3, and T4 of timing pulses may be tuned for a particular group such that all nozzles belonging to that group dispense an amount of material relatively close to a desired amount.

Steps 404, 405, and 406 sequentially allow each group of nozzles to dispense an amount of material. In step 404, the configuration for a group of nozzles is loaded into the print head. The configuration may comprise a firing pattern and a timing pattern. In step 405, nozzles in the group of nozzles whose configuration is loaded in step 404 are fired. In step 406, the loading and firing of each group of nozzles are repeated to complete deposition of material on a substrate.

In another embodiment of the present invention, a uniform coat of material may be deposited on a substrate by controlling the number of times a nozzle is fired within a firing period. Nozzles that have relatively large drop volumes (also referred to as "high output nozzles") may be fired less often than those that have relatively small drop volumes (also referred to as "low output nozzles"). Controlling the placement of droplets on a substrate to take into account merging of material on the substrate also helps in obtaining a more uniform coating. These features of the present invention are now described beginning with FIG. 5.

FIG. 5 schematically illustrates an example print area 500 comprising an array of "pixels" in accordance with an embodiment of the present invention. Each pixel represents a spot or location on a substrate where a droplet of material may be dispensed. In the example of FIG. 5, the print area comprises an 8×8 array of pixels. Other array sizes may also be used depending on the application. In the example of FIG. 5, each pixel is labeled as "(row, column)" with the upper left corner pixel being (0,0). That is, pixel (0,1) is on row 0, column 1; pixel (0,2) is on row 0, column 2; pixel (1,0) is on row 1, column 0; pixel (1,1) is on row 1, column 1; and so on. Note that only some of the pixels on print area 500 are labeled in the interest of clarity.

A 64-nozzle print head 210 (see FIG. 2) may be employed to deposit material on print area 500. In that case, print head 210 may be divided into 4 sets of nozzles, with each set comprising 8 consecutive nozzles. For example, nozzles 212-1 to 212-8 may comprise the first set, nozzles 212-9 to 212-16 may comprise the second set, and so on. Each set of nozzles may be fired to deposit droplets of material on the first row of pixels. With 64 nozzles 212, droplets of material may be dispensed on a row of pixels for 4 separate print areas. Nozzles 212 may be stepped down to each row of print area 500 and fired. Therefore, stepping down and firing nozzles 212 8 times will cover 4 print areas 500 using a 64-nozzle print head 210. As used in the present disclosure, "firing period" refers to a string of firings to cover a given print area. In the example of FIG. 5, print area 500 uses a firing period of 8 firing steps (one for each row) to cover print area 500 with material. To cover an entire substrate comprising of several print areas 500, the firing period may be repeated several times.

To compensate for drop volume variations between nozzles, the number of times a nozzle is fired for a given firing period may be varied. For example, high output nozzles may be fired less often than low output nozzles. That is, low output nozzles may be fired in every firing step of a firing period, while high output nozzles may be fired in a few or none of the firing steps of the firing period. Medium output nozzles may be fired in a number of firing steps more than high output nozzles, but less than low output nozzles. This results in a "dithering" effect that balances the amount of material dispensed on a substrate. It is to be noted that unlike dithering in a paper printing application, which assumes a uniform drop volume for all nozzles and therefore does not compensate for it, the dithering effect in the present, embodiment is achieved partly by taking into account the varying drop volume of the nozzles.

Determining the drop volume of each nozzle of a print head identifies high output, medium output, and low output nozzles. Once the drop volumes of nozzles are determined, equation 1 below may be used to determine the number of times a nozzle should fire per timing period:

$$\text{firings\_per\_period} = \text{INT}\left(\left(\text{steps}\frac{Vol_{lowest}}{Vol_{current}}\right) + 0.5\right). \quad \text{EQ 1}$$

In equation 1, "firings_per_period" is the number of times the current nozzle will fire, "INT" indicates an integer operation for rounding the result to the nearest integer, "steps" indicates the number of firing steps in the firing period, "$Vol_{lowest}$" indicates the lowest drop volume in all of the nozzles, and "$Vol_{current}$" indicates the drop volume of the current nozzle (the one whose firings_per_period is being determined). From equation 1, a nozzle with the lowest drop volume will be fired 8 times in a firing period of 8 firing steps (i.e., 100% firing rate), whereas a nozzle with the highest drop volume will be fired anywhere from 0 to 7 times in the same firing period (i.e., less than 100% firing rate). Note that equation 1 has been provided as an example, not a limitation. Other ways of determining the number of times a nozzle should fire to obtain a uniform coating on a substrate may also be used without detracting from the merits of the present invention.

After the number of firings per firing period has been determined for each nozzle, the firings of the nozzles are distributed to promote merging of material on the substrate. This may be accomplished by spreading the firings of the nozzles. More specifically, the firing steps (or step) where a nozzle is fired may be staggered or interleaved to promote merging of material on a substrate. One way of distributing the firings of nozzles are now discussed with reference to FIG. 6.

FIG. 6 shows an example firing table 600 for 9 different firing sequences (firing sequence numbers 0 to 8), in accordance with an embodiment of the present invention. A firing sequence identifies the firing steps (or step) where a nozzle is fired within a firing period. In the example of FIG. 6, each firing sequence is arranged in columnar fashion, and each row corresponds to a firing step. In the example of FIG. 6, chart 600 has eight rows, and may thus be used with firing periods having 8 firing steps. Also, in the example of FIG. 6, the cells are in binary where a logical "1" indicates a firing and a logical "0" indicates no firing. For example, firing sequence number 0 indicates that a nozzle will not fire in any of the firing steps, firing sequence number 1 indicates that a nozzle will fire only in firing step 0 (first row; see cell 601), firing sequence number 2 indicates that a nozzle will fire only in firing steps 0 and 4 (see cells 602 and 603), firing sequence number 8 indicates that a nozzle will fire in all of the firing steps, and so on. Each nozzle is assigned a firing sequence number commensurate with the number of times it is to be fired per firing period. For example, a nozzle that is to be fired 8 times per firing period may be assigned firing sequence number 8, whereas a nozzle that is to be fired once per firing period may be assigned firing sequence number 1. As another example, a nozzle assigned firing sequence number 1 will only fire in firing step 0 of the firing period, a nozzle assigned firing sequence number 2 will only fire in firing steps 0 and 4 of the firing period, a nozzle assigned firing sequence number 8 will fire in all of the firing steps of the firing period, and so on.

To promote merging of material on a substrate, firing table 600 is arranged such that nozzle firings are spread out in a firing sequence. Firing table 600 achieves a "gray-scale" effect where all 0's represent white and all 1's represent black. Other ways of spreading the firing of nozzles may also be used without detracting from the merits of the present invention.

To further enhance the merging of material on a substrate, the assigned firing sequence number for a nozzle may be altered to take into account adjacent firing sequence numbers. That is, a nozzle may be assigned a different firing sequence number to further blend the resulting deposited line of material with adjacent deposited lines. One way of further enhancing the merging of material on the substrate is now described with reference to FIG. 7.

FIG. 7 shows an example offset table 700 for staggering adjacent firing sequence numbers in accordance with an embodiment of the present invention. Offset table 700 provides an offset that may be used to alter a nozzle's firing sequence number, and thereby interleave droplet placement on a substrate. In the example of FIG. 7, each cell of offset table 700 is in decimal and indicates an offset used for adjusting down the firing sequence number of the current nozzle (i.e., the one to be fired). For example, cell 701 indicates that the firing sequence number of the current nozzle is to be subtracted by 3, cell 702 indicates that the firing sequence number of the current nozzle is to be subtracted by 0, and so on. As another example, assuming the current nozzle is assigned firing sequence number 7, an offset of "3" indicates that the current nozzle is now assigned firing sequence number 4 (i.e., 7 minus 3), an offset of "0" indicates that current nozzle is still assigned firing sequence number 7, and so on.

In the example of FIG. 7, an offset may be located on table 700 by knowing the firing sequence number used to fire the last nozzle prior to the current nozzle, and the firing sequence number used to fire the nozzle prior to the last nozzle. Using print head 210 as an example (see FIG. 2), if the current nozzle is nozzle 212-3, then the last nozzle is nozzle 212-2 and the prior to last nozzle is 212-1. As another example, assuming nozzle 212-1 is fired using firing sequence number 7 and nozzle 212-2 is fired using firing sequence number 2, the offset for nozzle 212-3 is "3" (see cell 701). The value and cell location of offsets in table 700 may be varied to suit the requirements of specific applications. Other ways of staggering adjacent firings to optimize merging of material on a substrate may also be used without detracting from the merits of the present invention.

As can be appreciated in light of the present disclosure, controlling the number of times a nozzle is fired within a firing period and controlling the placement of droplets on a substrate to take into account merging of material on the substrate help in obtaining a uniform coating without severely affecting print frequency. Using the just described techniques, a serially loaded print head 210 may be employed to dispense IC fabrication materials on a substrate without the need for separate timing circuits for each nozzle or bulky cabling.

Figure 8:
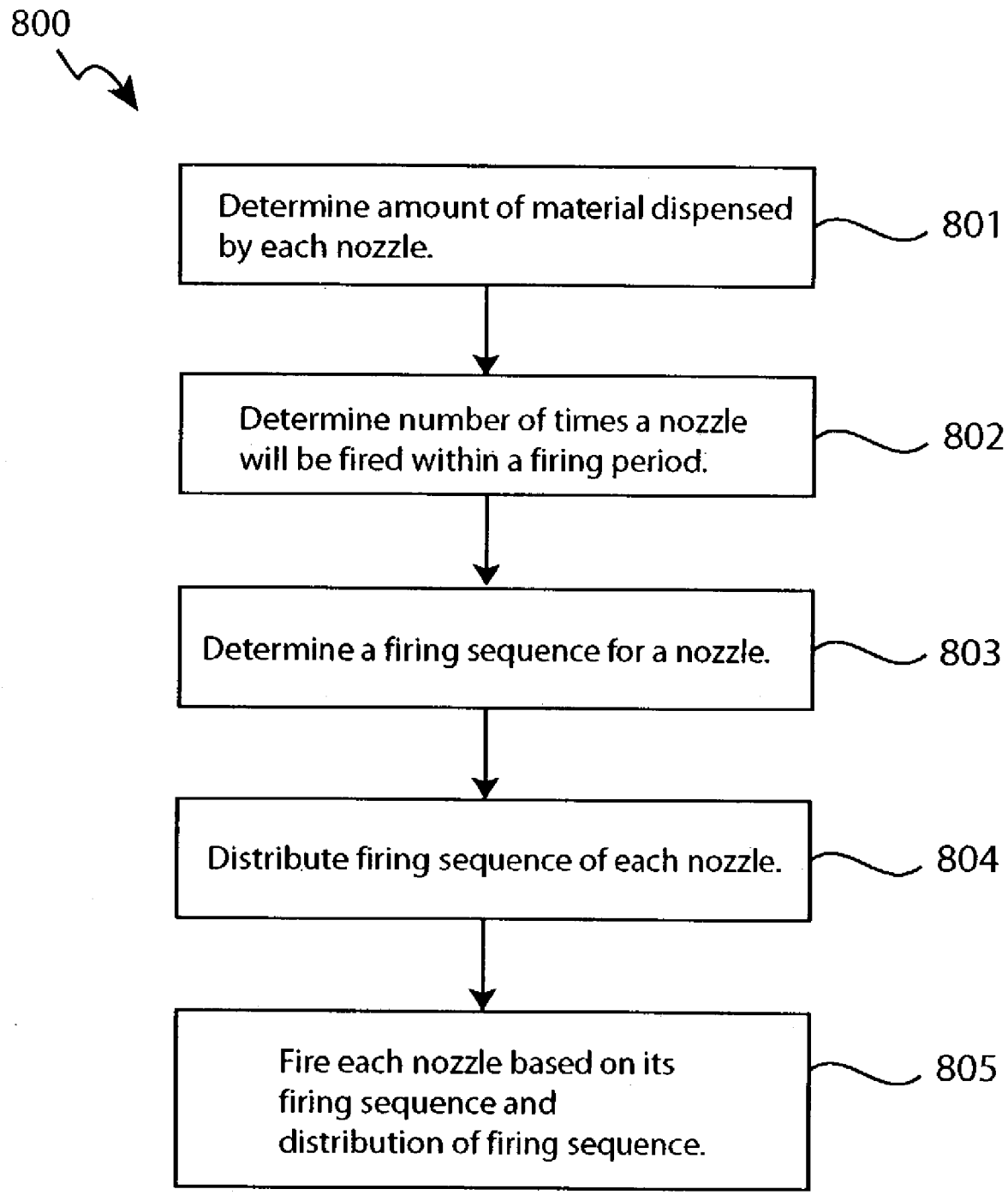
FIG. 8 shows a flow diagram of a method of dispensing a material from a print head in accordance with an embodiment of the present invention.

FIG. 8 shows a flow diagram of a method 800 for dispensing a material from a print head in accordance with an embodiment of the present invention. Beginning in step 801, the amount of material dispensed by each nozzle of a print head is determined. The amount of material may be in terms of drop mass or drop volume, for example. The drop mass of a nozzle, which can be converted to drop volume, may be measured using the technique disclosed in commonly-assigned U.S. application Ser. No. 10/087,539, which is incorporated herein by reference in its entirety. Drop volume of a nozzle may also be determined by printing a single line of material and then measuring the cross section of the line using a profilometer. Other techniques for measuring the drop volume or drop mass of a nozzle may also be employed without detracting from the merits of the present invention.

Steps 802, 803, and 804 promote merging of material on a substrate to obtain uniform coating thereon. In step 802, the number of times a nozzle will be fired during a firing period is determined. The number of times a nozzle will be fired may depend on the amount of material a nozzle can dispense. High output nozzles may be fired less often than low output nozzles, while medium output nozzles may be fired a number of times between that of high output and low output nozzles.

In step 803, a firing sequence for each nozzle is determined. The firing sequence identifies the firing steps (or step) where a nozzle is fired within a firing period. A firing period may comprise several firing steps. In one embodiment, the number of firing steps in a firing period matches the number of rows of a print area. For example, an 8×8 print area may have 8 firing steps per firing period.

In step 804, the firing sequence of each nozzle is distributed. Step 804 may be performed by altering a nozzle's firing sequence based on the firing sequence of adjacent nozzles. A firing sequence may be distributed by interleaving or staggering firing sequences.

In step 805, each nozzle of a print head is fired according to its firing sequence and distribution of firing sequence.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of dispensing an integrated circuit (IC) fabrication material onto a substrate, the method comprising:

serially loading a digital firing pattern into a firing register of a print head, the print head comprising a plurality of nozzles, each bit of the firing pattern controlling whether to fire a corresponding nozzle in the plurality of nozzles;

providing common timing pulses to all nozzles in the plurality of nozzles; and controlling a firing sequence of a first nozzle in the plurality of nozzles for a predetermined firing period, the firing sequence of the first nozzle being based on an amount of material the first nozzle dispenses.

2. The method of claim 1 wherein the amount of material the first nozzle dispenses is in terms of drop volume.

3. The method of claim 1 wherein controlling the firing sequence of the first nozzle comprises:

consulting a firing table to determine a first firing pattern; and firing the first nozzle based on the first firing pattern.

4. The method of claim 1 further comprising:

altering the firing sequence of the first nozzle based on a firing sequence of a second nozzle, the firing sequence of the second nozzle being based on an amount of material the second nozzle dispenses.

5. The method of claim 4 wherein altering the firing sequence of the first nozzle comprises:

consulting an offset table to determine an offset, the offset being based on a firing sequence of a second nozzle and a firing sequence of a third nozzle; and using the offset to find a firing sequence in a firing table.

6. In an integrated circuit (IC) fabrication system, a method of dispensing a material from a print head, the method comprising:

assigning a first firing sequence to a first nozzle, the first firing sequence indicating when the first nozzle will fire within a predetermined time period, the first firing sequence being based on an amount of material the first nozzle dispenses;

assigning a second firing sequence to a second nozzle, the second firing sequence indicating when the second nozzle will fire within the predetermined time period, the second firing sequence being based on an amount of material the second nozzle dispenses; and altering a third firing sequence of a third nozzle based on the first firing sequence and the second firing sequence, the third firing sequence indicating when the third nozzle will fire within the predetermined time period.

7. The method of claim 6 wherein assigning the first firing sequence comprises consulting a firing table.

8. The method of claim 7 wherein altering the third firing sequence comprises consulting an offset table that provides adjustments to firing sequences indicated in the firing table.

9. A method of depositing an integrated circuit (IC) fabrication material on a substrate, the method comprising:

determining an amount of material dispensed by each nozzle in a plurality of nozzles of a print head;

determining a number of times a first nozzle in the plurality of nozzles will fire within a firing period to obtain a first firing sequence;

serially loading a digital firing pattern into a firing register of the print head, each bit of the firing pattern controlling whether to fire a corresponding nozzle in the plurality of nozzles, the firing pattern being based on the first firing sequence;

providing common timing pulses to all nozzles in the plurality of nozzles; and using the first firing sequence to dispense a material from the first nozzle.

10. The method of claim 9 further comprising:

determining a number of times a second nozzle in the plurality of nozzles will fire within the firing period to obtain a second firing sequence; and using the second firing sequence to dispense the material from the second nozzle.

11. The method of claim 10 further comprising:

altering a third firing sequence for a third nozzle based on the first firing sequence and the second firing sequence.

12. The method of claim 9 further comprising:

altering the first firing sequence based on a previous firing sequence to promote merging of the material on a semiconductor substrate.

* * * * *